United States Patent [19]

Iwamura et al.

[11] Patent Number: 5,153,452

[45] Date of Patent: Oct. 6, 1992

[54] BIPOLAR-MOS IC WITH INTERNAL VOLTAGE GENERATOR AND LSI DEVICE WITH INTERNAL VOLTAGE GENERATOR

[75] Inventors: Masahiro Iwamura; Shigeya Tanaka; Tatsumi Yamauchi; Ikuro Masuda, all of Hitachi; Tetsuo Nakano, Ome, all of Japan

[73] Assignee: Hitachi Ltd., Tokyo, Japan

[21] Appl. No.: 401,849

[22] Filed: Aug. 30, 1989

[30] Foreign Application Priority Data

Aug. 31, 1988 [JP] Japan .............................. 63-217255

[51] Int. Cl.⁵ .......................... H03K 3/01; H03K 3/26
[52] U.S. Cl. ................................. 307/296.1; 307/303; 307/571; 307/296.7; 307/296.4; 365/226
[58] Field of Search ............... 307/296.1, 296.7, 296.5, 307/303, 570, 571, 296.6; 365/226, 229

[56] References Cited

U.S. PATENT DOCUMENTS

| | | | |
|---|---|---|---|
| 512,849 | 2/1876 | Copeland, III | 307/296.4 |
| 3,927,335 | 12/1975 | Keller et al. | 307/296.6 |
| 3,978,473 | 8/1976 | Pastoriza | 307/296.6 |
| 4,189,909 | 2/1980 | Marum | 307/296.6 |
| 4,224,536 | 9/1980 | Cutsogeorge | 307/296.7 |
| 4,710,905 | 12/1987 | Uchida | 365/229 |
| 4,754,160 | 6/1988 | Ely | 307/64 |
| 4,786,826 | 11/1988 | Clemente | 307/296.1 |

FOREIGN PATENT DOCUMENTS 107560 6/1984 Japan .
178763 11/1984 Japan .

Primary Examiner—Edward P. Westin
Assistant Examiner—Richard Roseen
Attorney, Agent, or Firm—Antonelli, Terry, Stout & Kraus

[57] ABSTRACT

There are provided a bipolar-MOS IC device smaller than half-micron scale, and a combination of such IC device and external circuits. The IC device has an internal voltage generating circuit for generating an internal power source by using an external power source, the voltage of the internal power source being lower than that of the external power source. The internal voltage generating circuit includes an NPN transistor formed in an N-type region or N-type island within a P-type semiconductor substrate of the IC device, and a PMOS transistor formed in the N-type island. The collector of the NPN transistor and the source of the PMOS transistor are used as external power source terminals. The drain of the PMOS transistor is connected to the base of the NPN transistor. The gate is used as a control signal terminal. The emitter of the NPN transistor is used as an internal power source output terminal. A current path from the external power source input terminal and the internal power source output terminal is accordingly formed within the N-type island isolated from the P-type substrate.

39 Claims, 13 Drawing Sheets

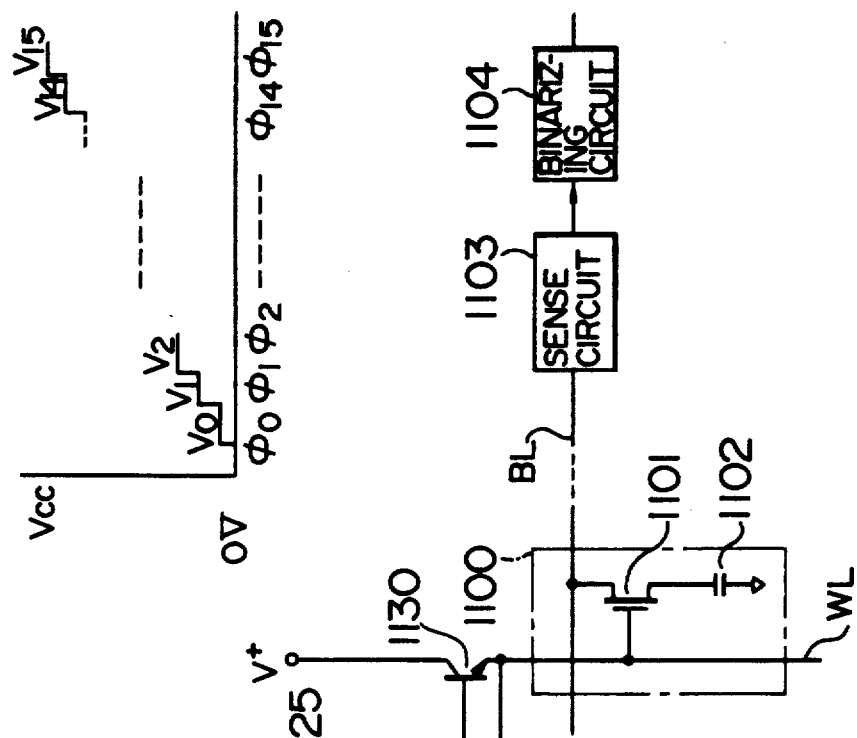
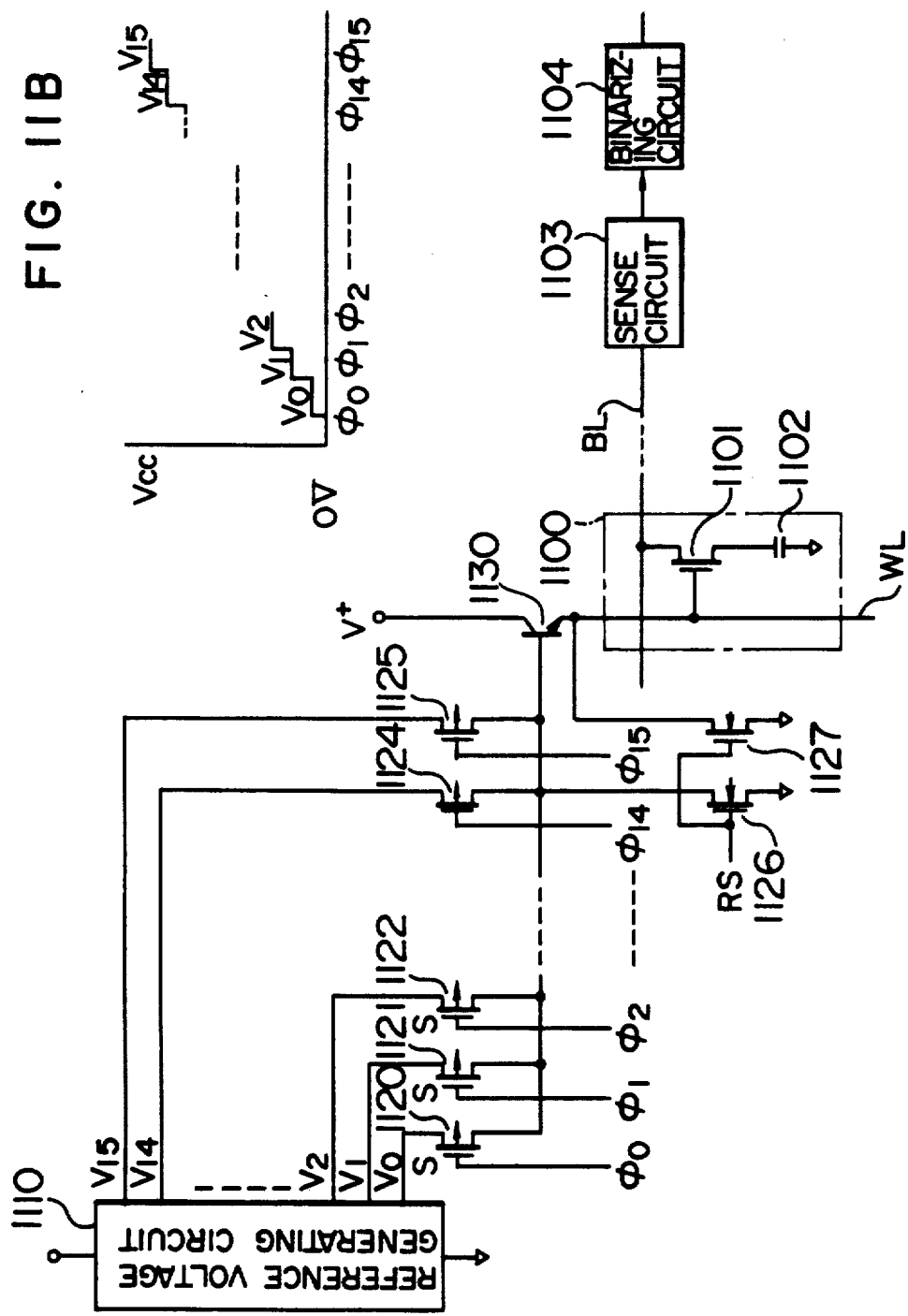

BIPOLAR-MOS IC WITH INTERNAL VOLTAGE GENERATOR AND LSI DEVICE WITH INTERNAL VOLTAGE GENERATOR

BACKGROUND OF THE INVENTION

The present invention relates to technology on bipolar-MOS (BiMOS) devices, and more particularly to an integrated circuit semiconductor device and an electronic apparatus using the device, the device including an internal voltage generating means for generating an internal voltage from an external power source voltage of a potential higher than the internal voltage and providing a power source for internal circuits.

Integrated circuit semiconductor devices, typically CMOS transistors, are generally powered with a 5 V power source.

The electric field in circuit elements becomes higher as the elements become finer. Change in the threshold voltage of MOS transistors, occurrence of punch-through, and the like are dependent upon the electric field. The electric field therefore has significant influences upon the element performance and reliability. For this reason, it is difficult for 0.5 micron or finer circuit elements to be operated with a 5 V power source. It is anticipated that a power source having a voltage of about 3.3 V will be used for such finer circuit elements.

Generally electronic circuits are presently driven with a standard 5 V power source. It becomes therefore necessary for semiconductor integrated circuits to internally generate a lower voltage power source by using the standard 5 V power source.

FIG. 12 is a circuit diagram showing an example of a conventional semiconductor integrated circuit having an internal voltage generating circuit. In FIG. 12, a reference numeral 1200 represents a semiconductor chip, and 1201 an NPN transistor (hereinafter simply called NPN). Reference numeral 1202 represents a parasitic collector resistance of NPN 1201, 1203 an external power source input terminal, 1204 a voltage detecting means formed of resistors R1 and R2, 1205 an amplifier, 1206 a reference voltage generator, 1207 an internal circuit formed of a P-channel MOS transistor (hereinafter simply called PMOS) M1 and an N-channel MOS transistor (hereinafter simply called NMOS) M2, Cw a capacitance at the emitter output line of NPN 1201.

In this semiconductor integrated circuit, an output from the reference voltage generator 1206 is compared with an output from the voltage detecting means 1204, and the output from the amplifier 1205 is used for the control of the base drive current of NPN 1201 to thereby obtain a predetermined output voltage.

FIG. 13 is a cross section of NPN, PMOS and NMOS of the circuit shown in FIG. 12. In FIG. 13, a reference numeral 1300 represents an N-type semiconductor substrate, and 1301 and 1302 P-type wells. The N-type substrate forms the collector of NPN 1201, the P-type well 1301 the base, an N+ diffused layer 1303 the emitter, and N+ and P+ diffused layers 1304 and 1305 the collector and base electrodes, respectively. Reference numerals 1306 and 1307 represent the collector parasitic resistances $rc_1$ and $rc_2$ of NPN 1201 which correspond to resistance $rc$ 1202 shown in FIG. 12. P+ diffused layers 1308 and 1309 form the source and drain electrodes of PMOS, and a polysilicon 1310 forms the gate electrode. A P-type well 1302 forms the substrate of NMOS, N+ diffused layers 1311 and 1312 form the drain and source electrodes, respectively and polysilicon 1313 forms the gate electrode.

FIG. 14 is a circuit diagram showing another example of a conventional semiconductor integrated circuit having an internal voltage generating circuit. In FIG. 14, a reference numeral 1400 represents a semiconductor chip, and 1401 a PNP transistor (hereinafter simply called PNP). Reference numeral 1402 represents a parasitic collector resistance of PNP 1401, 1403 an external power source input terminal, 1404 a voltage detecting means composed of resistors R1 and R2, 1405 an amplifier, 1406 a reference voltage generator, 1407 an internal circuit composed of PMOS M1 and NMOS M2, Cw a capacitance at the emitter line of PNP 1401.

In this semiconductor integrated circuit, an output from the reference voltage generator 1406 is compared with an output from the voltage detecting means 1404, and the output from the amplifier 1405 is used for the control of the base current drive of PNP 1401 to thereby obtain a predetermined output voltage.

FIG. 15 is a cross section of PNP, PMOS and NMOS of the circuit shown in FIG. 14. In FIG. 15, reference numeral 1500 represents a P-type semiconductor substrate, and 1501 and 1502 N-type wells. The P-type substrate forms the collector of PNP 1401, the N-type well 1501 the base, a P+ diffused layer 1503 the emitter, and P+ and N+ diffused layers 1504 and 1505 the collector and base electrodes, respectively. Reference numerals 1506 and 1507 represent the collector parasitic resistances $rc_1$ and $rc_2$ of PNP 1401 which correspond to resistance $rc$ 1402 shown in FIG. 14.

N+ diffused layers 1508 and 1509 form the source and drain electrodes of NMOS, and a polysilicon 1510 the gate electrode. An N-type well 1502 forms the substrate of PMOS, P+ diffused layers 1511 and 1512 the drain and source electrodes, and polysilicon 1513 the gate electrode.

The above conventional circuits are disclosed in, for example, Japanese Patent Laid-open Publication JP-A-59-178763 laid open on Oct. 11, 1984.

The internal voltage generating circuit fabricated within a semiconductor integrated circuit must satisfy at least the following requirements:

(1) A power source current should not pass through the semiconductor substrate.

The reason for this is that if a power source current flows into the semiconductor substrate, the substrate potential will fluctuate to cause a latch-up or an undesired coupling to internal circuits.

(2) A difference between the internal voltage of the internal voltage generating circuit and the external power source voltage should not be too large a value when the internal voltage generating circuit supplies a predetermined load current.

The reason for this requirement is that if the internal voltage is set at 3.3 V, for example, by using a standard 5 V external power source, a voltage drop of 1.7 V only is permitted, otherwise a non-standard power source having a voltage higher than 5 V is required.

(3) Noise superposed on the internal voltage of the internal voltage generating circuit as a result of the switching operation of load internal circuits can be eliminated satisfactorily.

The reason for this requirement is that noise which is superposed on the power source will increase because of an icnrease in the switching rate as the circuit elements are made finer and highly sophisticated. Further, since the noise margin of the internal circuit becomes small if a lower power source voltage is used, it is impossible to eliminate power source noise satisfactorily.

As understood from the above requirements, the circuit structure shown in FIG. 13 is associated with the problem that a power source current passage from the external power source Vin to the internal power source Vout is formed within the N-type semiconductor substrate 1300.

Further, the semiconductor substrate 1300 generally of a low impurity concentration has large collector parasitic resistances $rc_1$ and $rc_2$. The collector parasitic resistances $rc_1$ and $rc_2$ are desired to have a predetermined value because of the following reason. Specifically, the condition is expressed by:

$$Vin \geq Vout + V_{BE} + I_L \times rc$$

for maintaining an active state (unsaturated operation region) of NPN transistor 1601 shown in the voltage drop circuit portion of FIG. 16, where Vin represents the input voltage from the external power source, and Vout the output voltage from the internal power source. FIG. 17 shows the relationship between a load current IL and a lower limit of the external power source voltage Vin, using the collector parasitic resistance rc as parameters. As seen from FIG. 17, if, for example, the external power source voltage Vin is 5 V and the internal power source voltage Vout is 3.3 V, then the collector parasitic resistance should be made smaller than 10 ohms in order to allow the load current $I_L$ of 100 mA.

Such requirements are also applicable to the circuit structure shown in FIG. 14.

JP-A-57-107560 laid open on Jun. 21, 1984 discloses an LSI made of fine MOS transistors and having a low voltage regulator therein. The above-described problem, howver is not considered in its disclosure.

SUMMARY OF THE INVENTION

It is therefore an object of the present invention to provide an integrated circuit semiconductor device eliminating a latch-up and a undesired coupling to internal circuits.

It is another object of the present invention to provide an integrated circuit semiconductor device having an internal voltage generating circuit with less voltage drop caused by a collector parasitic resistance.

It is a further object of the present invention to provide an integrated circuit semiconductor device and an electronic apparatus using the device, capable of regulating the voltage of the internal power source and controlling to turn on and off the internal power source.

It is a still further object of the present invention to provide an integrated circuit semiconductor device and an electronic apparatus using the device, capable of being powered with different power sources, and having a built-in low voltage power source circuit suitable for BiMOS LSIs smaller than a half-micron scale.

According to an aspect of the present invention which solves the above objects, there is provided a semiconductor integrated circuit comprising internal voltage generating for generating an internal voltage by using an external power source voltage of a potential higher than the internal voltage and providing a power source for an internal circuit, wherein the internal voltage generating circuit is comprised of an NPN transistor formed in an N-type island in a P-type semiconductor substrate and a PMOS transistor formed in the N-type island, the collector of the NPN transistor and the source of said PMOS transistor are used as external power source inputting terminals, the drain of said PMOS transistor is connected to the base of said NPN transistor, the gate of said PMOS transistor is used as a control signal terminal, and the emitter of said NPN transistor is used as an internal power source outputting terminal, and whereby the path through which current flows from the external power source inputting terminal to said internal power source outputting terminal (or node) is formed within said N-type island isolated from said P-type substrate.

The semiconductor integrated circuit having the above-described fundamental circuit elements further includes means for providing the output from said internal voltage generating circuit to an external pin mounted outside of said semiconductor integrated circuit.

The semiconductor integrated circuit having the above-described fundamental circuit elements further includes switching means for switching potentials between the internal power source potential and a reference potential by using said external control signal, whereby when said switching means turns on, said internal power source potential is reset to said reference potential or a potential near said reference potential.

In the semiconductor integrated circuit constructed as above, the NPN transistor and PMOS transistor constituting the internal voltage generating circuit which is a main feature of the present invention, are formed in an N-type island so that the path or passage of a power source current is restricted within the N-type island.

The PMOS transistor supplying the base current to the NPN transistor has its source applied with an external power source and its gate supplied with a control signal, to thereby provide an internal power source voltage regulating and on-off controlling function.

Since the output from the internal voltage generating circuit is arranged to be applied to an external connecting pin, not only an external bypass capacitor can be connected to the external pin to eliminate noise of the internal power source, but also the internal power source voltage can be monitored or another semiconductor integrated circuit can be powered, respectively via the external connecting pin.

Further, if a circuit for resetting the output of the internal voltage generating circuit is provided, a power source sequence control or the other control is possible whereby a plurality of semiconductor integrated circuits are turned on and off sequentially.

BRIEF DESCRIPTION OF THE DRAWINGS

FIGS. 11A, 11B show the circuit arrangement and graph of a seventh embodiment of the present invention;

DESCRIPTION OF THE PREFERRED EMBODIMENTS

Figure 1:
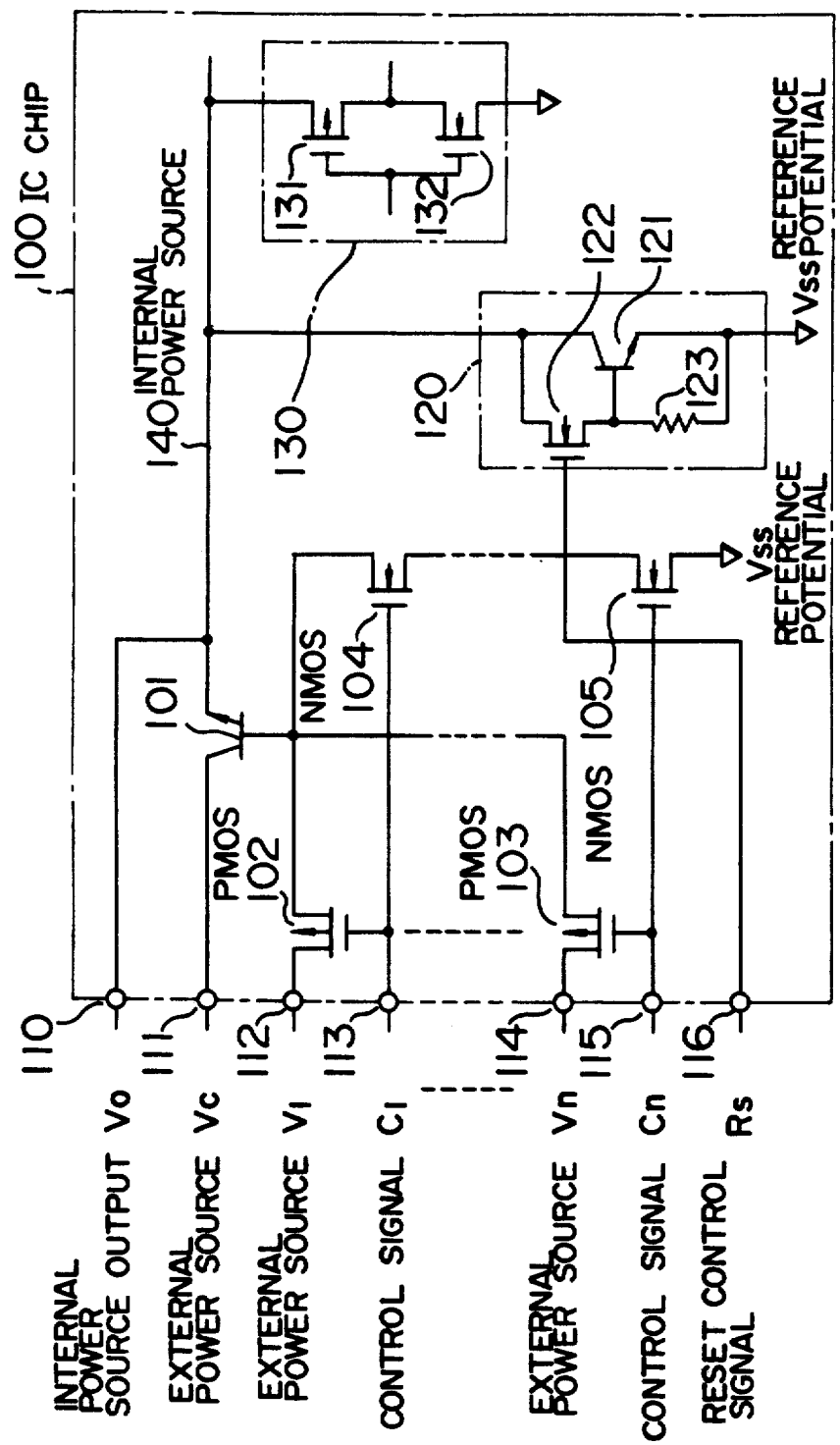
FIG. 1 shows the circuit arrangement of a first embodiment of the semiconductor integrated circuit according to the present invention.

The first embodiment of the semiconductor integrated circuit of the present invention is shown in FIG. 1. In FIG. 1, a reference numeral 100 represents an integrated circuit chip. Reference numeral 101 represents an NPN transistor whose collector is connected to an external power source 111 and whose emitter is connected to an internal power source output 140. Reference numeral 102 represents a PMOS transistor having its source connected to another external power source 112, its gate to a control signal 113, and its drain to the base of NPN transistor 101. Reference numerals 104 and 105 represent NMOS transistors serially connected between the base of NPN transistor 101 and a reference potential Vss, the gates thereof being connected to control signals 113 and 115, respectively. Reference numeral 120 represents a reset circuit for switching the internal power source output 140 to a lower potential. The reset circuit 120 is comprised of an NPN transistor 121, an NMOS transistor 122 and a resistor 123. The NPN transistor 121 has its emitter connected to the reference potential Vss. The NMOS transistor 122 has its drain and source respectively connected to the collector and base of the NPN transistor 121, and its gate connected to a reset control signal 116. The resistor 123 is connected between the base and emitter of NPN transistor 121. Reference numeral 130 represents an internal circuit powered with the internal power source output 140, the internal circuit in this embodiment being an inverter circuit composed of a PMOS transistor 131 and NMOS transistor 132.

The operation of the semiconductor integrated circuit will now be described. It is assumed that terminals 111, 112, 114 are supplied with first, second and third voltages, respectively, and that a control signal 115 is at a logical level "1" and a reset control signal 116 is at a logical level "0". When a control signal 113 becomes "0" level, PMOS transistor 102 turns on to supply the base current to NPN transistor 101. When NPN transistor 101 turns on, a power source current is supplied from the external power source terminal 111 to the internal circuit 130 via NPN transistor 101. The voltage Vout from the internal power source output 140 is expressed by $$V_{out} = V_{in} - V_{BE} - \frac{1}{\beta} I_L \cdot r_p \tag{1}$$

where
Vin : voltage at terminal 112,
$V_{BE}$: base-emitter voltage of NPN transistor 101;
$r_p$: on-resistance of PMOS transistor 102;
$\beta$: current amplification factor of NPN transistor 101;
$I_L$: load current.

If the circuit is designed so as to have a small value of the third term of the above equation, the internal voltage Vout can be determined by the source voltage of PMOS transistor 102 and $V_{BE}$ of NPN transistor 101.

This means that an arbitrary power source voltage can be set in the integrated circuit chip 100 by changing the base control voltage at the external pin 112.

Similarly, if the control signal 115 takes a level "0", PMOS transistor 103 turns on so that the potential at terminal 114 determines the output voltage Vout. If both the control signals 113 and 115 take levels "1", PMOS transistors 102 and 103 turn off and NMOS transistors 104 and 105 turn on. The base potential of NPN transistor 101 therefore takes a Vss level so that NPN transistor 101 turns off and a power supply from the external power source terminal 111 to the internal circuit 130 is stopped. In this case, the potential of the internal power source drops to the reference potential Vss at a rate determined by the time constant of the load circuit. The potential drop rate cannot be regulated by simply turning off NPN transistor 101. In view of this, there is provided the internal reset circuit 120 which can solve the problem of the potential lowering rate. Upon setting the reset control signal 116 at a level "1", NMOS transistor 122 and NPN transistor 121 turn on so that the internal voltage level can be switched rapidly to the Vss level.

A terminal pin 110 is provided so as to provide the internal power source output 140 to the outside of the integrated circuit chip 100. The provision of this terminal 110 allows various applications such as eliminating noise of the internal power source, externally monitoring and controlling the internal power source condition, and so on.

Figure 2:
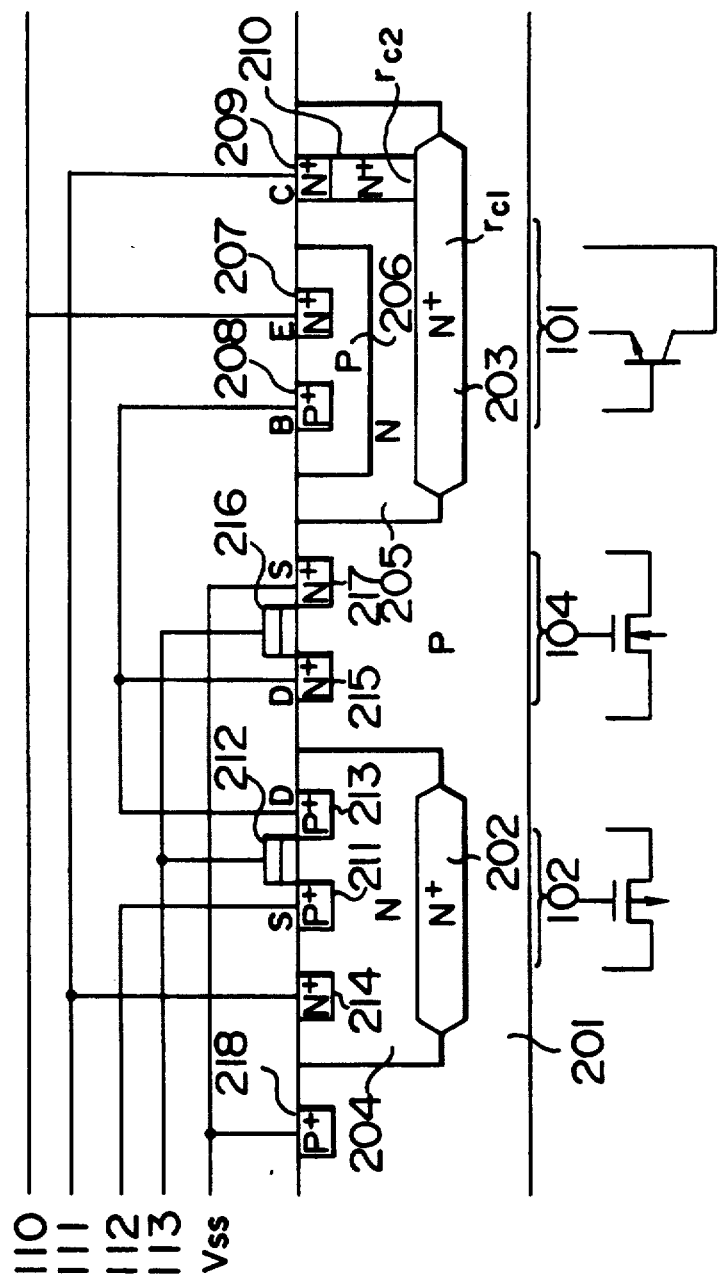
FIG. 2 is a cross section showing the semiconductor device shown in FIG. 1.

FIG. 2 is a cross section of the main devices of the embodiment shown in FIG. 1, including NPN transistor 101, PMOS transistor 102 and NMOS transistor 104. In FIG. 2, in a P-type semiconductor substrate 201, there are formed N-type well regions 204 and 205 each having N+ buried layers 202 and 203. NPN transistor 101 is formed such that the N-type well 205 is used as the collector, the P-type diffused layer 206 as the base, and the N+ diffused layer 207 as the emitter. The base electrode is connected to a P+ diffused layer 208. The collector electrode is connected to a N+ diffused layer 209. In addition, there is further formed an N+ deeply diffused layer 210 called a collector sink which interconnects the N+ diffused layer 209 and N+ buried layer 203. The interconnected N+ buried layer 203 and N+ diffused layer 210 are provided so as to make the collector parasitic resistance small. The collector region 205 is electrically isolated from the semiconductor substrate 201. PMOS transistor is formed such that a P+ diffused layer 211 is used as the source, a polysilicon layer 212 as the gate, and a P+ diffused layer 213 as the drain. The N-type well 204 serving as a substrate for PMOS transistor 102 is connected to the external power source 111 via the N+ diffused layer 214. NMOS transistor 104 is formed such that an N+ diffused layer 215 is used as the drain, a polysilicon layer 216 as the gate, and an N+ diffused layer 217 as the source. The substrate for NMOS transistor 104 is the same substrate 201 as for the chip, the substrate 201 being connected to the reference potential Vss via a P+ diffused layer 218.

Figure 3:
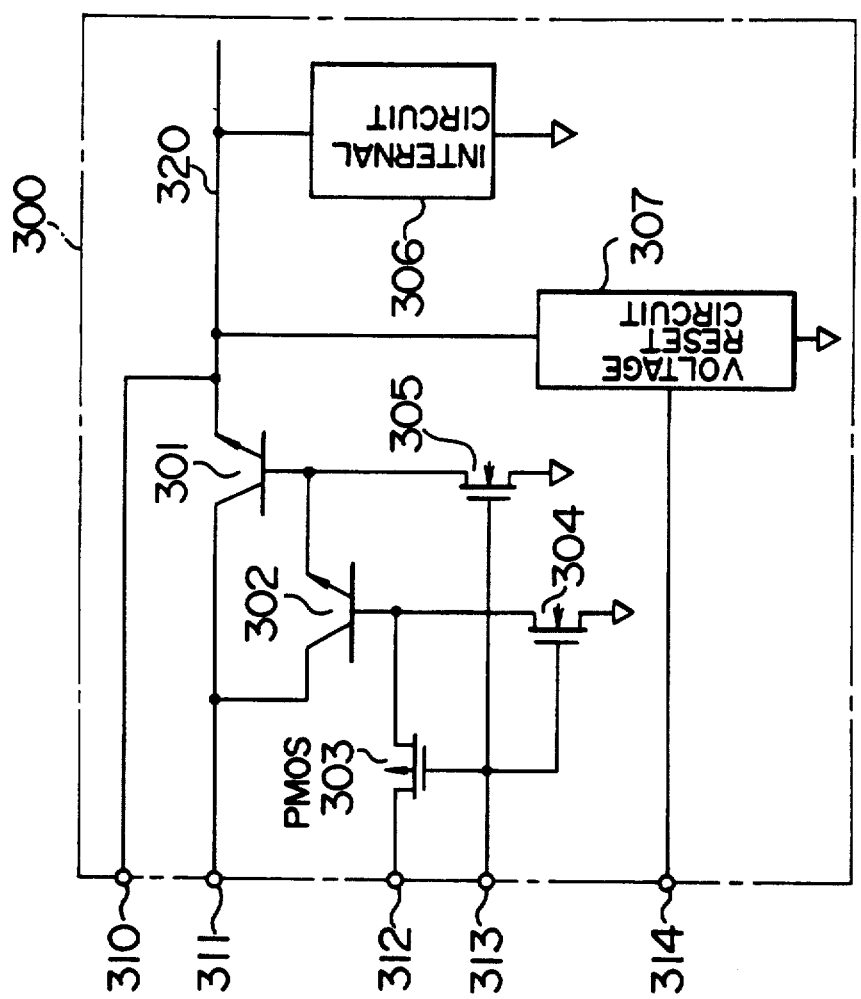
FIG. 3 shows the circuit arrangement of a second embodiment of the present invention.

FIG. 3 shows the second embodiment of the integrated circuit semiconductor device according to the present invention. In FIG. 3, reference numeral 300 represents a semiconductor chip. An NPN transistor 301 has its collector connected to an external power source terminal 311 and its emitter connected to an internal power source output 320. NPN transistor 301 is Darlington-connected with an NPN transistor 302 whose collector and emitter are connected to the collector and emitter of NPN transistor 301, respectively. A PMOS transistor 303 has its source connected to another external power terminal 312, its gate to a control signal terminal 313, and drain to the base of NP transistor 302. Reference numerals 304 and 305 represent NMOS transistors whose drains are respectively connected to the bases of NPN transistors 302 and 301, and whose gates are connected in common to the control signal terminal 313. Reference numeral 306 represents an internal circuit, 307 a voltage reset circuit, and 314 a reset signal terminal. Reference numeral 310 represents a terminal for applying the internal power source output to the outside of the semiconductor chip.

The operation of the semiconductor integrated circuit of the second embodiment will be described. It is assumed that terminals 311 and 312 are supplied with first and second voltages, respectively, and that a reset signal 314 is at level "0". When a control signal 313 becomes "0" level, PMOS transistor 303 turns on to supply the base current to NPN transistor 302. When NPN transistor 302 turns on, NPN transistor 301 also turns on. A power source current is therefore supplied from the external power source terminal 311 to the internal circuit 306 via NPN transistor 301. The voltage Vout from the internal power source output 320 is expressed by $$V_{out} = V_{in} - 2V_{BE} - \frac{1}{\beta 2} I_L \cdot r_p \quad (2)$$

where

Vin: voltage at terminal 312, $V_{BE}$: base-emitter voltage of NPN transistor 301, 302;

$r_p$: on-resistance of PMOS transistor 303;

$\beta$: current amplification factor of NPN transistor 301, 302

$I_L$: load current.

If the circuit is designed so as to have a small value of the third term of the above equation, the internal voltage Vout can be determined by the source voltage of PMOS transistor 303 and $V_{BE}$ of NPN transistors 301 and 302. For example, if Vin is 5 V and is 0.8 V, the internal power source voltage Vout becomes about 3.4 V.

Similarly, if the control signal 313 takes a logical level "1", PMOS transistor 303 turns off and NMOS transistors 304 and 305 turn on. NPN transistors 301 and 302 also turn off so that a power supply from the external power source terminal 311 to the internal circuit 306 is stopped. A reset circuit 307 corresponds to the reset circuit 120 shown in FIG. 1. Upon setting the reset control signal 314 at a level "1", this voltage reset circuit 307 rapidly switches the level of the internal power source voltage 320 to the Vss level. Reference numeral 310 represents a terminal for applying the internal power source output to the external of the integrated circuit chip.

Figure 4:
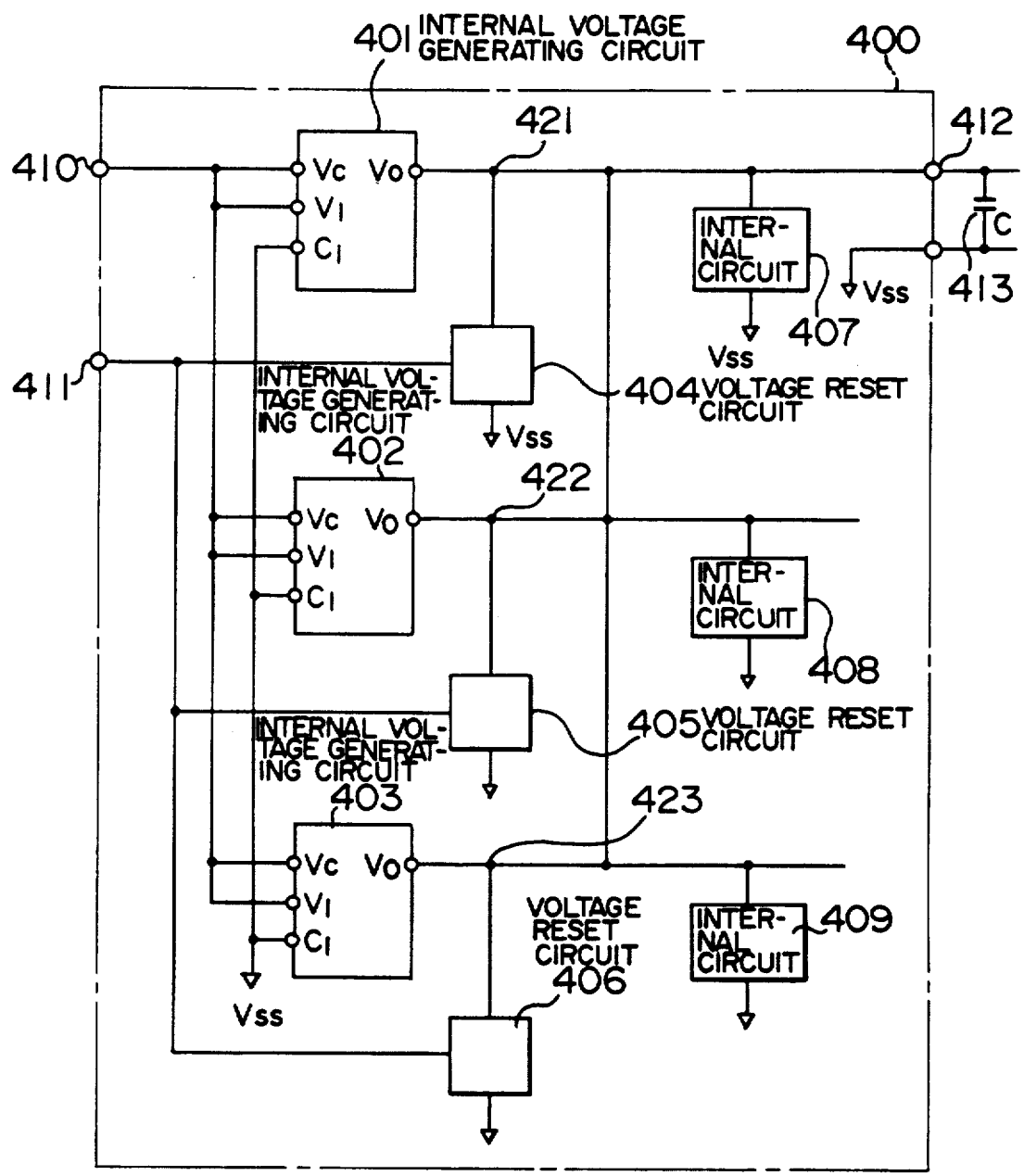
FIG. 4 shows the circuit arrangement of a third embodiment of the present invention.

FIG. 4 shows the third embodiment of the semiconductor integrated circuit according to the present invention. In FIG. 4, a reference numeral 400 represents a semiconductor chip, and reference numerals 401, 402 and 403 each represent an internal voltage generating circuit of the type, for example, as shown in FIGS. 1 and 3. The external power source applied to a terminal 410 is inputted to terminals Vc and V1, and the same voltage 421, 422, 423 is outputted from terminals V0. The same voltage outputs are commonly connected within the chip to supply it to internal circuits 407, 408 and 409. A terminal C1 of each internal voltage generating circuit 401 to 403 is an on-off control terminal. In this embodiment, the terminal C1 is connected to Vss to always maintain active the circuits 401 to 403. However, the invention is not limited to such circuit arrangement, but the terminal C1 may be connected to an external connecting pin to allow an on-off control by using the external pin. Reference numerals 404 to 406 each represent a voltage reset circuit of the type, for example, as shown in FIG. 1 at 120. The voltage reset circuit performs an on-off operation in accordance with the level at a reset signal terminal 411. When the voltage reset circuits turn on, the outputs V0 from the circuits 401 to 403 are switched to the Vss level, whereas when the voltage reset circuits turn off, the outputs V0 from the circuits 401 to 403 take a predetermined value lower than the external power source voltage 410 to accordingly power the internal circuits 407 to 409. Reference numeral 412 represents a terminal for applying the internal powe source voltage to the outside of the semiconductor chip, this terminal 412 corresponding to the terminal 110 shown in FIG. 1. High frequency noise is superposed upon the internal power source because of the switching operation of circuit elements in the internal circuits 407 to 409. It is therefore essential to those scaled devices having a low noise margin under low voltage operation that the internal power source noise should be properly eliminated and reliable operation without malfunction should be ensured. In order to eliminate high frequency noise, it is effective to provide a bypass capacitor between the internal power source and Vss. A semiconductor integrated circuit having a conventional internal voltage generating circuit, however, has no sufficient area for implementing a large capacitor within the chip, so that it is practically impossible to eliminate internal power source noise. According to this embodiment which achieves the object of solving this problem and other objects, there is provided the external terminal 412 connected to the internal voltage generating circuit. Reference numeral 413 represents an external bypass capacitor connected between the terminal 412 and Vss. Since the bypass capacitor can be connected externally, the capacitance thereof can be selected as desired depending upon the noise of the internal power source. As a result, the internal circuits 407 to 409 attain highly reliable operation without any adverse effects from noise.

Further, in this embodiment, a plurality of internal voltage generating circuits 401 to 403 are connected in common at their outputs. Therefore, even if the outputs of the internal voltage generating circuits differ from each other, the internal circuits 407 to 409 are powered always with the same voltage. A change in switching rates of the internal circuits caused by internal power source voltage difference can therefore be eliminated. In addition, a latch-up is also eliminated because the main reason for latch-up in CMOS transistors is attributable to the difference of internal power source voltages supplied to internal circuits.

Figure 5:
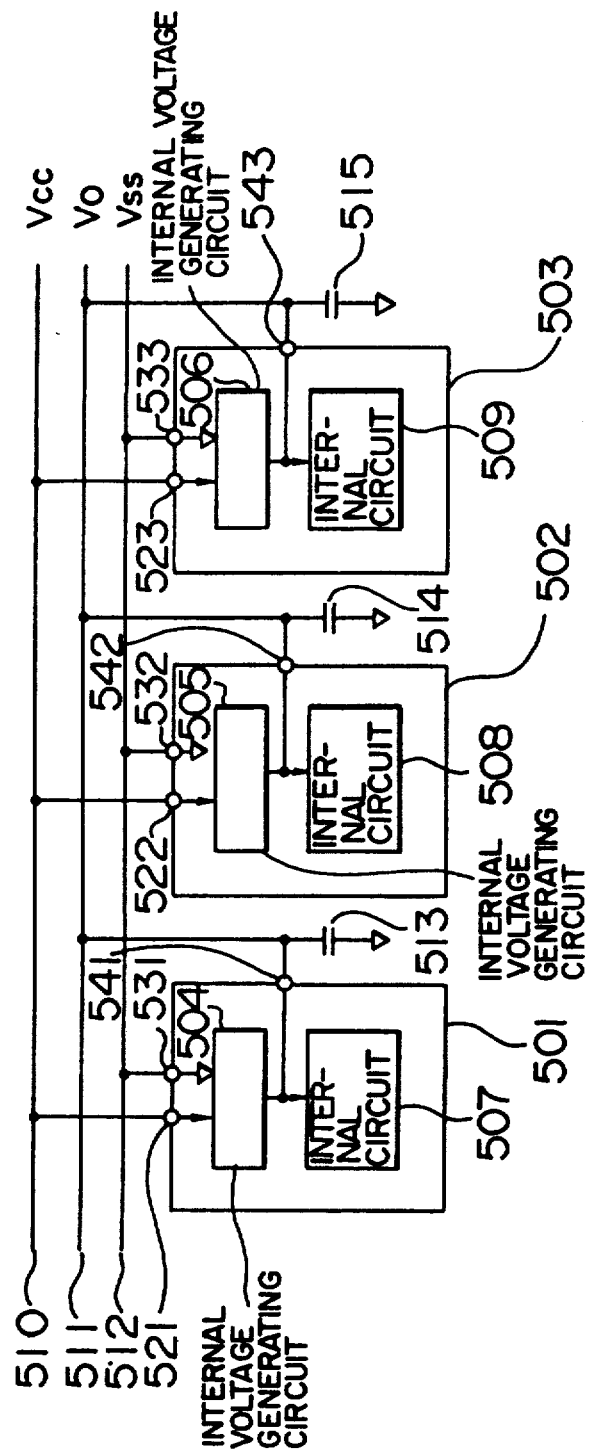
FIG. 5 shows the circuit arrangement of a fourth embodiment of the present invention.

FIG. 5 shows an embodiment of an electronic apparatus to which the semiconductor integrated circuit of this invention is applied. Referring to FIG. 5, integrated circuit chips 501 to 503 have input terminals 521 to 523 for an external power source 510, reference potential terminals 531 to 533, and internal voltage output terminals 541 to 543. The integrated circuit chips 501 to 503 have internal voltage generating circuits 504 to 506 to power respective internal circuits 507 to 509.

In this embodiment, the internal voltage generating circuits 504 to 506 supply power to the associated internal circuits 507 to 509, and in addition, the output of the internal voltage generating circuits 507 to 509 are connected to respective external terminals 541 to 543 which are connected in common to an external line 511. An advantage of this circuit arrangement is that the internal circuits 507 to 509 in a plurality of semiconductor chips can be driven under the same internal power source condition. In addition, this embodiment has another advantage. Namely, since the power source current to each internal circuit varies from time to time, if a power source current to one chip increases, power source currents to other chips can be shared with the current increasing chip. Capacitors 513 to 515 connected between the external terminals 541 to 543 and the reference potential are the bypass capacitors for eliminating high frequency noise.

Figure 6:
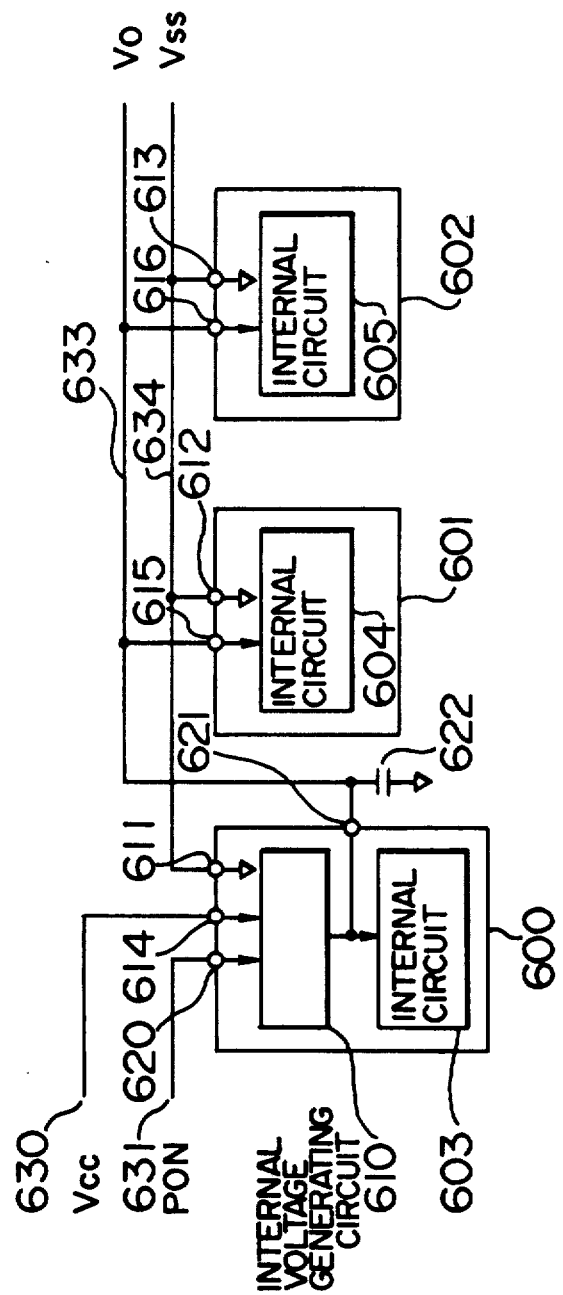
FIG. 6 shows the circuit arrangement of an example of applications of the present invention.

FIG. 6 shows another embodiment of an electronic apparatus to which the semiconductor integrated circuit of this invention is applied. Referring to FIG. 6, semiconductor chips 600 to 602 have internal circuits 603 to 605. The semiconductor chip 600 has an internal voltage generating circuit 610 whose output is supplied to the internal circuit 603 and connected to a terminal 621. The internal voltage generating circuit 610 is supplied with an external power source via a terminal 614. The operation of the circuit 610 is controlled by, although not limited thereto, an on-off control signal 620. The output of the internal voltage generating circuit 610 is connected to the terminal 621 to supply power to the other semiconductor chips 601 and 602 via an external line 633. Reference numerals 611 to 613 represent reference potential terminals, and reference numeral 622 represents a bypass capacitor for noise elimination. According to this embodiment, the semiconductor chips 601 and 602 are not required to have an internal voltage generating circuit so that the degree of integration of the internal circuits can be improved correspondingly.

Figure 7:
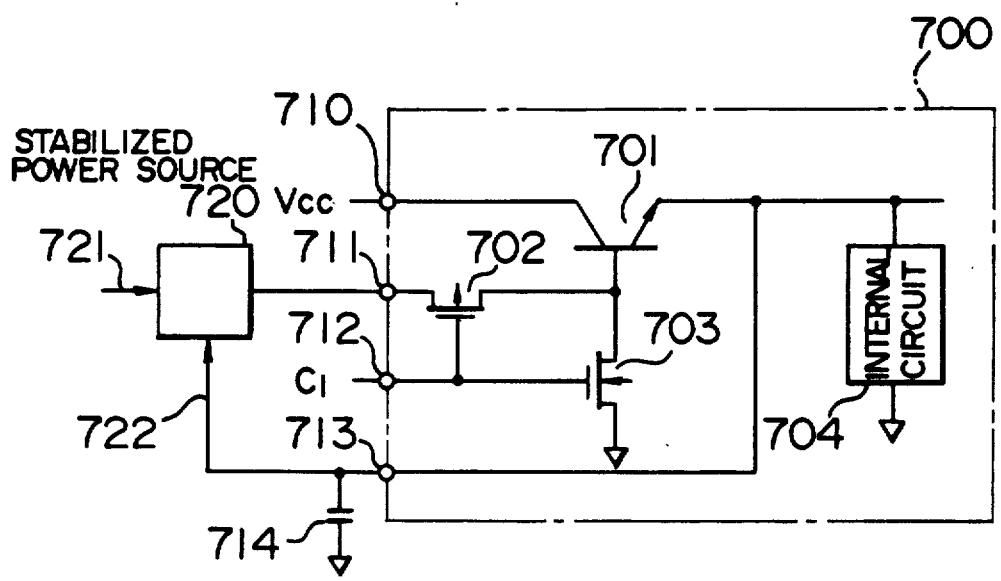
FIG. 7 shows the circuit arrangement of another example of applications of the present invention.

FIG. 7 shows the fourth embodiment of the semiconductor integrated circuit according to the present invention. In FIG. 7, a reference numeral 700 represents an integrated circuit chip, 701 an NPN transistor, 702 a PMOS transistor, and 703 an NMOS transistor. NPN transistor 701 has its collector connected to an external power source terminal 710, and an internal power source voltage is supplied from the emitter to an internal circuit 704. PMOS transistor 702 has its source connected to an external power source terminal 711, its gate to a control signal 712, and its drain to the base of NPN transistor 701. NMOS transistor 703 has its gain connected to the control signal 712 and its source connected to a reference potential. Reference numeral 720 represents a stabilized power source provided outside of the semiconductor chip 700, the output thereof being connected to the external power source terminal 711. The output of the internal power source connected to a terminal 713 is fed back to the stabilized power source 720 to control the output voltage thereof to the terminal 721. Reference numeral 714 represents a bypass filter for high frequency noise elimination.

According to this embodiment, high frequency power source noise are eliminated by the bypass capacitor 714, whereas a fluctuation, at low speed, of the internal power source voltage can be compensated by controlling the output potential of the stabilized power source 720. As a result, a highly stable supply power can be advantageously supplied to the internal circuit 704.

Figure 8:
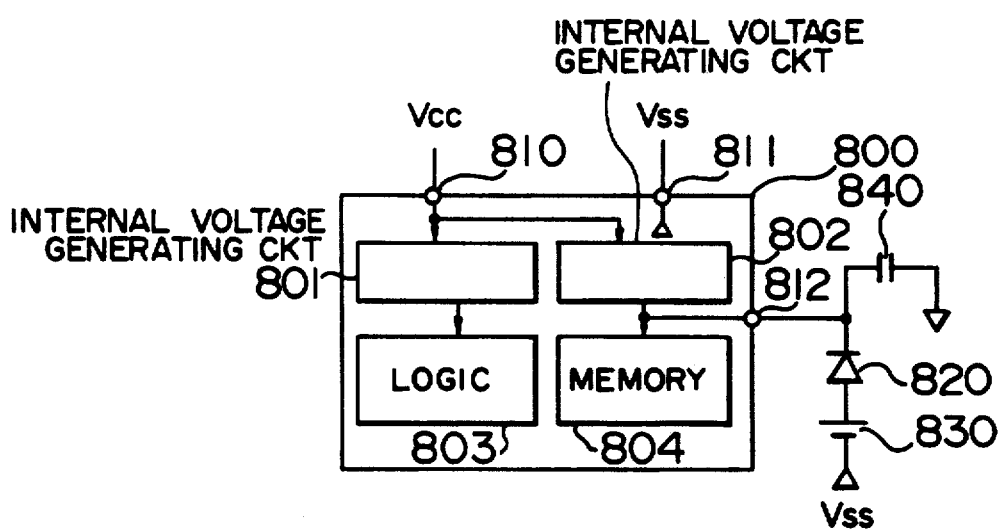
FIG. 8 shows the circuit arrangement of a fifth embodiment of the present invention.

FIG. 8 shows the fifth embodiment of the semiconductor integrated circuit according to the present invention. In FIG. 8, a reference numerals 801 and 802 represent internal voltage generating circuits the outputs of which are supplied to the associated internal circuits 803 and 804 which are, for example, a logic circuit and a memory, respectively. Reference numeral 810 represents an external power source terminal, 811 a reference potential terminal, and 812 a terminal for applying the output of the internal voltage generating circuit 802 to an external circuit. A diode 820 and external power source 830 are connected between the terminal 812 and the reference potential. Reference numeral 840 represents a bypass capacitor connected between the terminal 812 and the reference potential.

According to this embodiment, it is advantageous that the terminal 812 serves also as the power source supply terminal from the external power source. Although not limited to the following case only, if the power source voltage for the memory internal circuit 804 drops to a predetermined value, a power is supplied from the external power sourc 830 to hold the contents of the memory.

Figure 9:
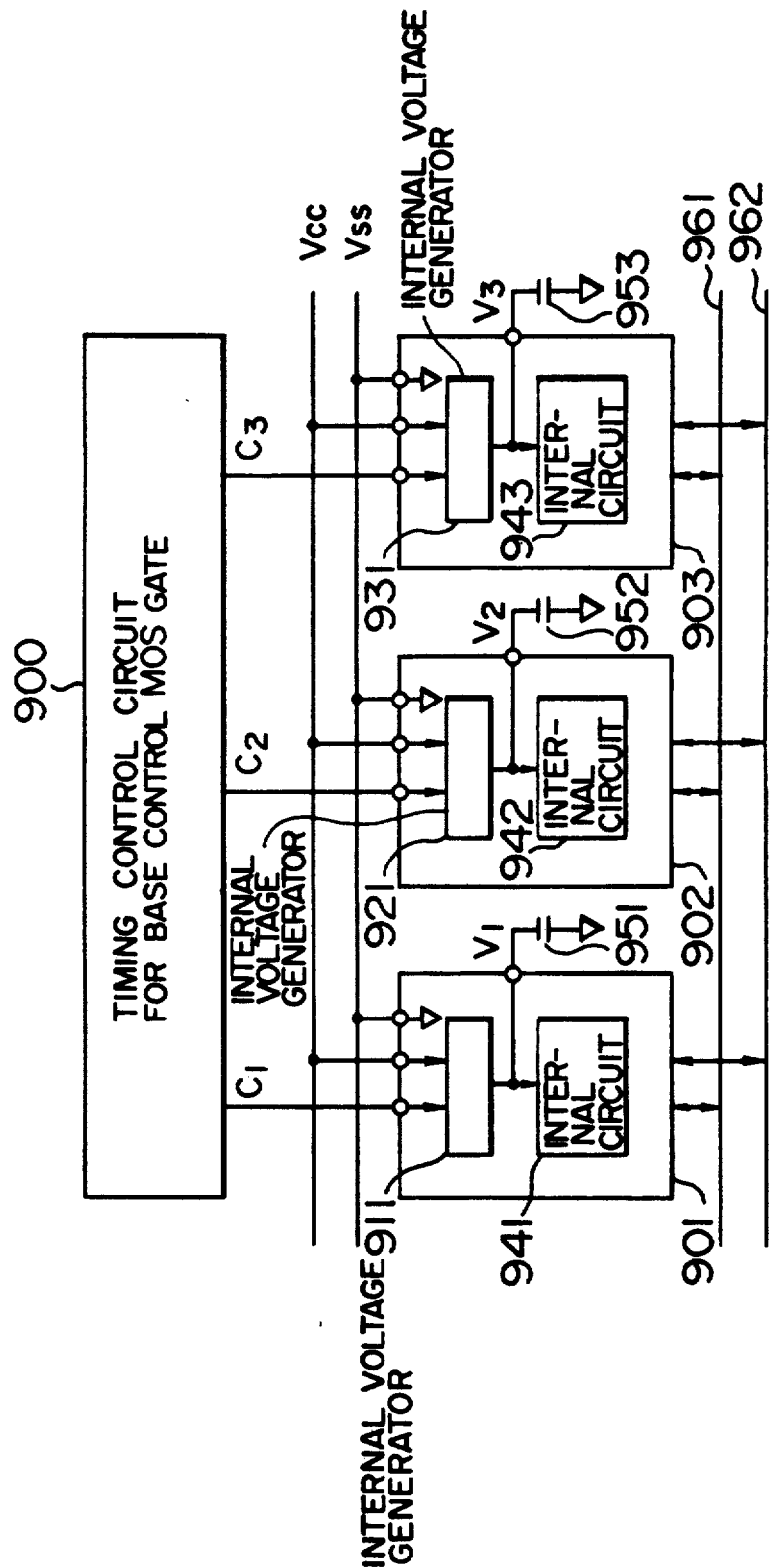
FIG. 9 shows the circuit arrangement of a sixth embodiment of the present invention.

FIG. 9 shows another embodiment of an electronic apparatus to which the semiconductor integrated circuit of this invention is applied. In FIG. 9, a reference numeral 900 represents a timing control circuit, 901 to 903 integrated circuit chips having their internal voltage generating circuits 911, 921 and 931, and internal circuits 941 to 943. An external power source Vcc and reference potential Vss are connected to the chips 901 to 903 to which on-off control signals C1 to C3 are supplied from the timing control circuit. The integrated circuit chips 901 to 903 are interconnected via a control line 961 and data line 962.

Figure 10:
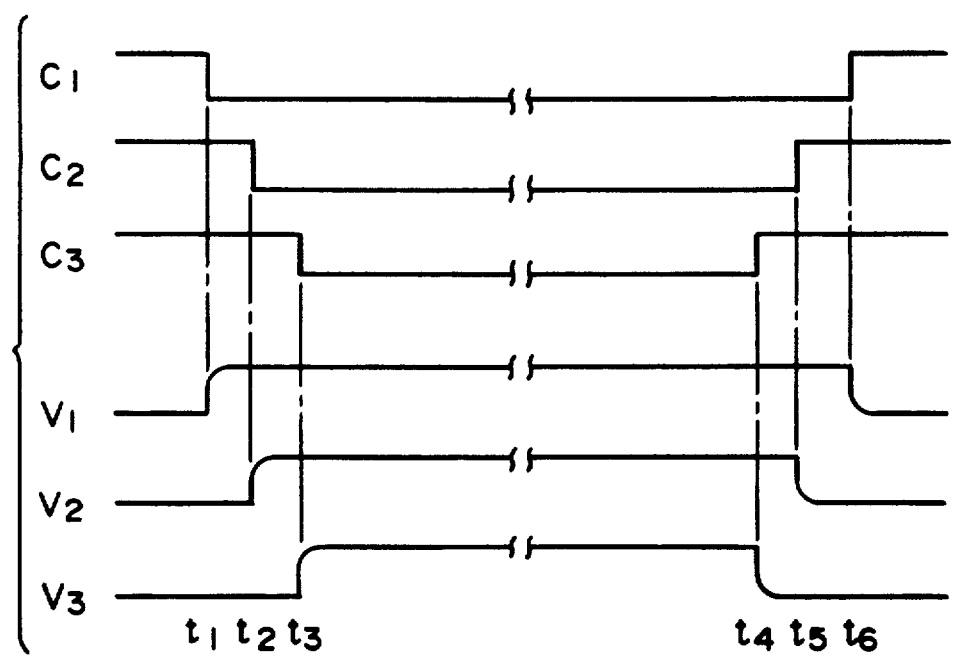
FIG. 10 is a timing chart illustrating the operation of the sixth embodiment shown in FIG. 9.
Figure 12:
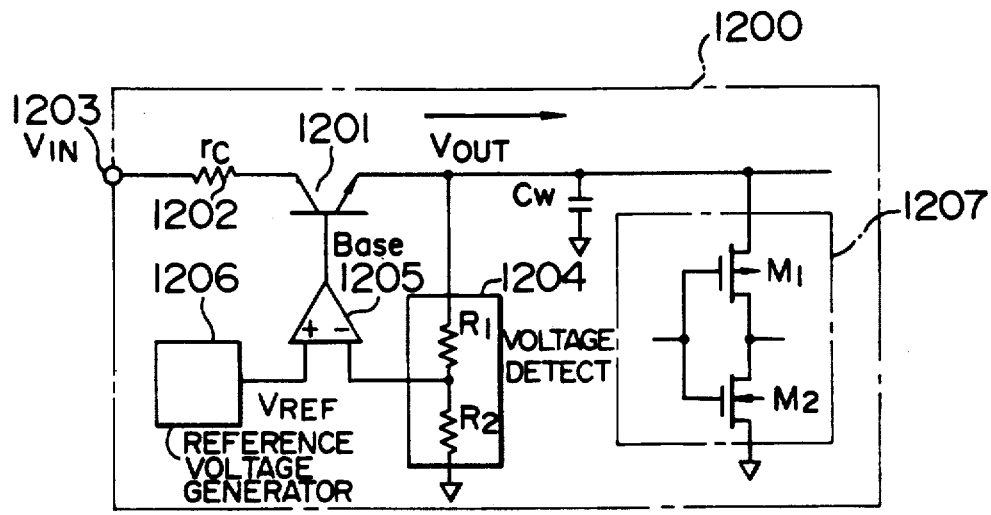
FIG. 12 shows the circuit arrangement of a conventional internal voltage generating circuit.
Figure 13:
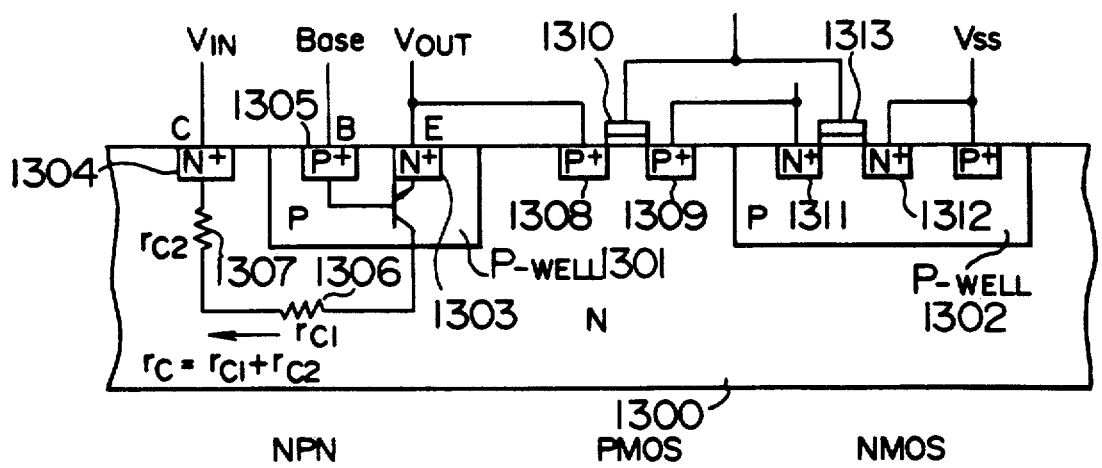
FIG. 13 is a cross section of the semiconductor device shown in FIG. 12.
Figure 14:
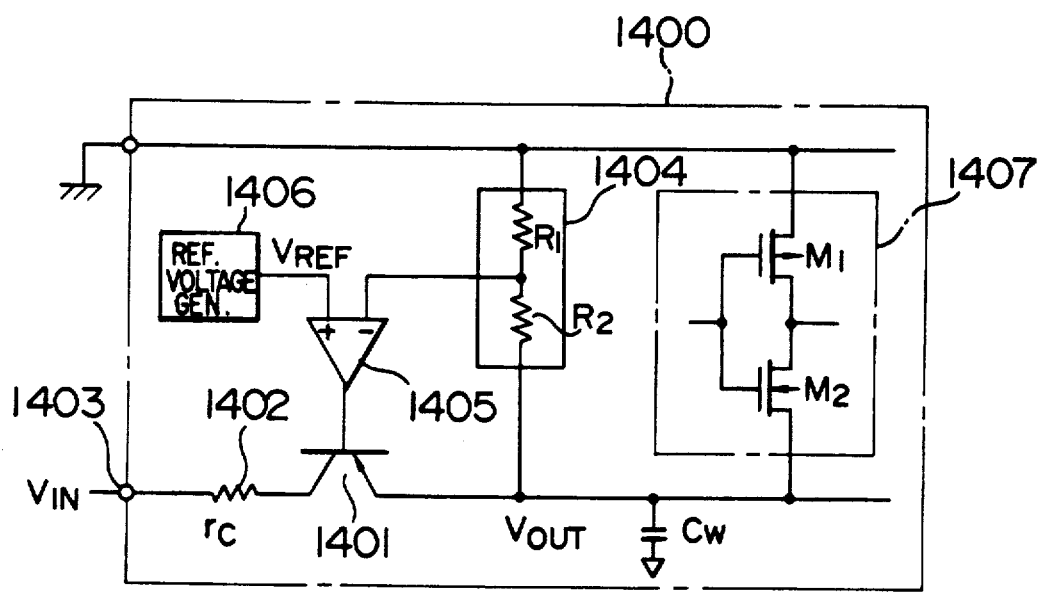
FIG. 14 shows the circuit arrangement of another conventional internal voltage generating circuit.
Figure 15:
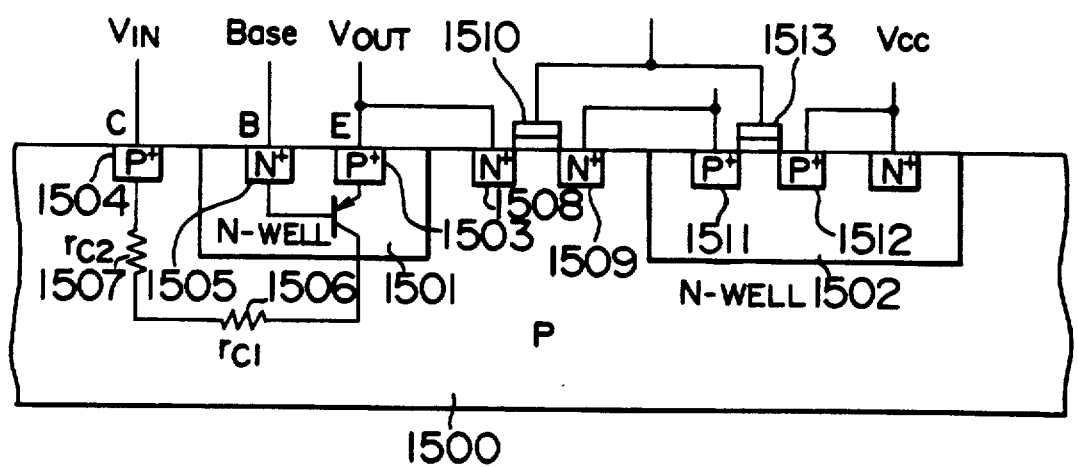
FIG. 15 is a cross section of the semiconductor device shown in FIG. 14.
Figure 16:
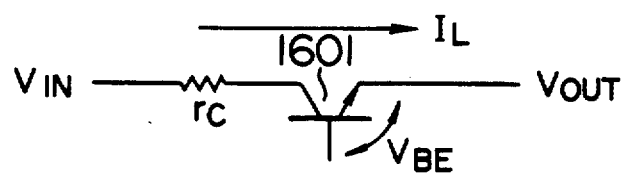
FIG. 16 is a model graph showing a voltage drop circuit portion.
Figure 17:
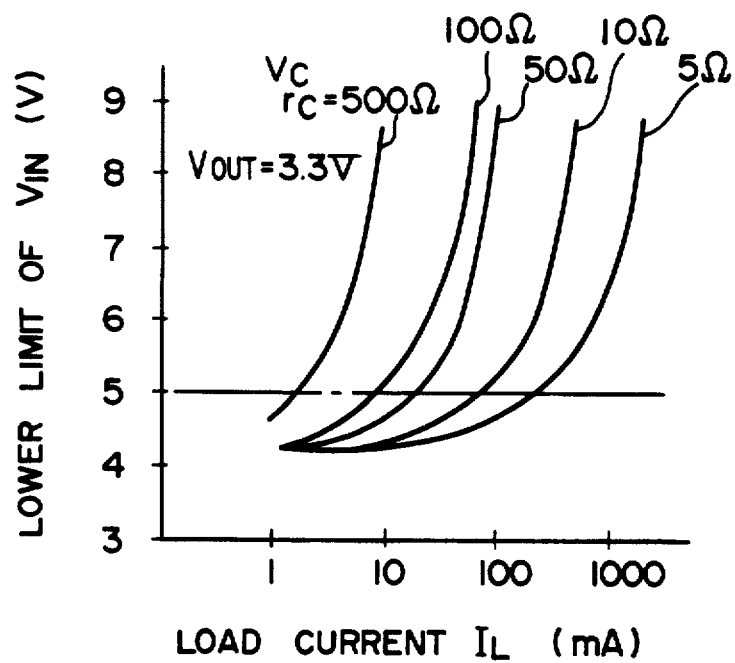
FIG. 17 is a graph showing the characteristics of the circuit portion shown in FIG. 16.

The timing control circuit 900 generates timing signals C1 to C3, for example, as shown in FIG. 10 to thereby control the sequence of power on-off of the integrated circuit chips 901 to 903. Upon reception of the timing signals, the output voltages V1 to V3 of the internal voltage generating circuits 911, 921 and 931 are sequentially turned on and off as shown in the sequence chart shown in FIG. 10.

According to this embodiment, since the internal voltage generating circuits 911, 921 and 931 themselves have an on-off control function, the power on-off sequence among a plurality of integrated circuit chips can be freely set by means of the external timing control circuit, to thereby provide a useful function for system applications.

FIGS. 11A and 11B show another embodiment of an electronic apparatus to which the semiconductor integrated circuit of this invention is applied. Referring to FIGS. 11A and 11B, a multi-value memory cell 1100 for storing multi-value information is constructed of a MOS transistor 1101 and capacitor 1102. The read operation for memory cell is as follows. When the potential at a word line WL is stepwise raised, MOS transistor 1101 turns on at a certain potential on the word line WL, depending upon the charge in the capacitor 1102, so that a bit line BL previously precharged to a high level is rendered at a low level. This level change is sensed by a sense circuit 1103 and converted into binary information at a binarizing circuit 1104 In the above operation, in order to read the content of a multi-value memory cell, it is necessary, as described above, to stepwise raise the potential on the word line WL. It takes, therefore, a very long time to read the memory content. How the potential on the word line WL can be changed rapidly from the lowest level to the highest level is a key to high speed memory read.

In view of this, there is provided a reference voltage generating circuit 1110 to generate voltages V0, V1, ..., V14, V15. These voltages are coupled to the sources of PMOS transistors 1120 to 1125 the gates of which are supplied with timing signals $\phi_0, \phi_1, \ldots, \phi_{14}, \phi_{15}$, and the drains of which are connected in common to the base of an NPN transistor 1130. The collector of NPN transistor 1130 is connected to a power source V++ and the emitter to the word line WL. Upon sequential application of the timing signals $\phi_0, \phi_1, \ldots, \phi_{14}, \phi_{15}$, transistors 1120, 1121, 1122, ..., 1124, 1125 sequentially turn on to supply a stepwise voltage to the emitter of NPN transistor 1130. According to this embodiment, the word line WL is driven by NPN transistor 1130 constituting an emitter follower, so that a large load (although only one memory cell is shown) on the word line WL can be driven at a high speed. A high speed read operation for multi-value memories is therefore possible. Another advantage is that the potential on the word line WL is determined only by the reference potentials V0, V1, V2, ..., V14, V15, and $V_{BE}$ of NPN transistor 1130.

NMOS transistors 1126 and 1127 shown in FIG. 11A are used for switching the potential of the base of NPN transistor 1130 and the potential on the word line WL, to the Vss level, in response to a control signal Rs.

As appreciated from the foregoing description of the semiconductor integrated circuit of the present invention, the semiconductor substrate is not used as a path of a power source current. It is therefore possible to prevent a latch-up and an undesired coupling to internal circuits.

It is also possible to present various system applications by regulating or turning on and off the voltage of the internal power source.

We claim:

1. An integrated circuit semiconductor device comprising:
   an internal voltage generating circuit for generating an internal voltage by using an external power source voltage of a higher potential than the internal voltage and providing a power source for an internal circuit,
   wherein said internal voltage generating circuit includes an NPN transistor formed in an N-type region on a P-type semiconductor substrate and at least one PMOS transistor formed in another portion of said N-type region, the collector of said NPN transistor and the source of said PMOS transistor are used as first and second external power source terminals, respectively, said external power source voltage is applied to at least the first external power source terminal, the drain of said PMOS transistor is connected to the base of said NPN transistor, the gate of said PMOS transistor is used as a control signal terminal, the degree of conductivity of said NPN transistor is controlled by a control signal applied to said control signal terminal, and the emitter of said NPN transistor serving as an internal power source outputting terminal, whereby a path through which current flows from said first external power source terminal to said internal power source outputting terminal is formed within said N-type region isolated from said P-type semiconductor substrate.

2. An integrated circuit semiconductor device according to claim 1, wherien the conductance of said PMOS transistor is controlled by said control signal applied to the gate of said PMOS transistor to allow said internal voltage generating circuit to have an operation range from an active state to an inactive state.

3. An integrated circuit semiconductor device according to claim 2, wherein said control signal for controlling the conductance of said PMOS transistor is supplied externally or internally of said integrated circuit.

4. An integrated circuit semiconductor device according to claim 1, wherein the collector of said NPN transistor and the source of said PMOS transistor each are connected to a different external power source.

5. An integrated circuit semiconductor device according to claim 1, wherein the collector of said NPN transistor and the source of said PMOS transistor are connected to external power source.

6. An integrated circuit semiconductor device according to claim 1, further comprising discharge means for discharging base charge of said NPN transistor, accumulated during conduction of said PMOS transistor, said discharge means including an NMOS transistor connected between the base of said NPN transistor and a reference potential.

7. An integrated circuit semiconductor device according to claim 6, wherein said NMOS transistor is turned on and off in response to an external control signal.

8. An integrated circuit semiconductor device according to claim 1, wherien said N-type region is an N-type island formed on said P-type semiconductor substrate, and said NPN transistor formed in said N-type island comprises an N-type buried layer of high impurity concentration and an N-type region of high impurity concentration which interconnects, at low resistance, said N-type buried layer and an N-type collector electrode connection region of high impurity concentration formed on the main surface plane of said semiconductor substrate.

9. An integrated circuit semiconductor device according to claim 1, comprising a plurality of PMOS transistors in which the drains thereof are connected in common to the base of said NPN transistor, the sources thereof are supplied with different external power source voltagse, and the gates thereof are supplied with gate control signals, whereby said internal power source voltage is determined based on the voltage supplied to the source of one of said plurality of PMOS transistors selected in response to the gate control signal thereof, and based on the base-emitter voltage of said NPN transistor.

10. An integrated circuit on a semiconductor device including means supplied with an external power source for providing, at an otuput thereof, an internal power source for an internal circuit, the internal power source being a voltage lower than a voltage of the external power source, comprising;
   switching means connected between said output, which has applied said internal power source, and a reference potential terminal, said switching means being controlled to be turned on and off in response to a control signal, wherein when said switching means turns on, said voltage of said internal power source is switched to about said reference potential.

11. An integrated circuit semiconductor device according to claim 10, wherein said switching means comprises an NPN transistor and an NMOS transistor, the collector of said NPN transistor is connected to said output which has applied said internal power source, the emitter is connected to said reference potential terminal, the gate of said NMOS transistor is connected to receive said control signal, the source of said NMOS transistor is connected to the base of said NPN transistor and the drain of said NMOS transistor is connected to the collector of said NPN transistor.

12. An integrated circuit semiconductor device comprisign:
   generation means supplied with an external power source of a predetermined voltage for providing, at an output thereof, an internal power source for an internal circuit of a voltage lower than the predetermined voltage of said external power source; and
   external pin means, connected to the output of the generation means, for providing an output from said internal power source.

13. In combination,
   at least one integrated circuit semiconductor device each one comprising internal power source means, supplied with an external power source, for providing, at an output thereof, an internal power source for an internal circuit of a voltage lower than a voltage of the external power source;
   external pin means connected to the output of said internal power source means for externally providing an output from said internal power source; and
   a bypass capacitor connected between said external pin means and a terminal of a reference potential for eliminating high frequency noise.

14. An integrated circuit semiconductor device comprising:
   a plurality of internal voltage generating circuits each being supplied with an external power voltage for respectively generating at outputs thereof an internal power voltage for an internal circuit, the internal power voltage being lower than the external power voltage,
   wherein the outputs of said plurality of internal voltage generating circuits are connected in common.

15. An integrated circuit semiconductor device according to claim 14, the commonly connected outputs of said plurality of internal voltage generating circuits are applied to an external pin.

16. An integrated circuit semiconductor device comprising a plurality of internal voltage generating circuits each being supplied with an external power voltage for generating therefrom an internal power voltage for an internal circuit, the internal power voltage being lower than the external power voltage,
   wherein the outputs of said plurality of internal voltage generating circuits are connected in common and are connected to an external pin; and
   a bypass capacitor connected between said external pin and a terminal of a reference potential for eliminating high frequency noise.

17. In combination,
   a plurality of integrated circuit semiconductor devices each comprising at least one internal voltage generating circuit supplied with an external power voltage for generating, at a corresponding output thereof, an internal power voltage for an internal circuit, the internal power voltage being lower than the external power voltage; and
   an external wiring for connecting together external pins to which the internal power voltages are applied, said external pins are respectively coupled to receive an output of an internal voltage generating circuit of a corresponding one of said plurality of integrated circuit semiconductor devices.

18. In combination,
   an integrated circuit semiconductor device comprising at least one internal voltage generating circuit supplied with an external power voltage, each one fo said at least one internal voltage generating circuit including means for generating an internal power voltage for a corresponding internal circuit, each internal power voltage generated being lower than the external power voltage;
   an external wiring for connecting together external pins to which the respective internal power voltages that are generated are applied; and
   at least a bypass capacitor connected to each of said external pins, which are commonly connected with said external wiring, for attenuating high frequency noise.

19. In combination,
   at least one integrated circuit semiconductor device comprising an internal voltage generating circuit supplied with an external power voltage for generating, at an output thereof, an internal power voltage for an internal circuit, the internal voltage being lower than the external power voltage and being provided at an external pin of the device for external application thereof; and
   an external wiring, being coupled to said external pin, for supplying said internal voltage as a power voltage for other integrated circuit semiconductor devices.

20. In combination,
   an integrated circuit semiconductor device comprisign an internal voltage generating circuit supplied with an external power voltage for generating, at an output thereof, an internal power votlage for an internal circuit, the internal power voltage being lower than the external power voltage and being provided at an external pin of the device for external application thereof;
   an external wiring, being coupled to said external pin, for supplying said internal voltage as a power voltage for other integrated circuit semiconductor devices; and at least a bypass capacitor coupled between said external pin and a terminal of a reference potential for eliminating high frequency noise.

21. An integrated circuit semiconductor device according to claim 19, wherein said integrated circuit semiconductor device having said internal voltage generating circuit includes means which functions to switch said internal power voltage generated to a reference potential level in response to an external control signal.

22. An integrated circuit semiconductor device comprising:

an internal voltage generating circuit comprising an NPN transistor and a PMOS transistor, the emitter of said NPN transistor being connected to an internal power source line and an external output pin, the source of said PMOS transistor being coupled to an output of an external stabilized power source, and the drain of said PMOS transistor being connected to the base of said NPN transistor;

an internal circuit powered with an output from said internal voltage generating circuit, and a feedback circuit, coupled between the output of said internal voltage generating circuit and said external stabilized power source, for controlling theoutput potential of said external stabilized power source to have a predetermined voltage level.

23. An integrated circuit semiconductor device according to claim 22, wherein a bypass capacitor for eliminating high-frequency noise is connected between the output of said internal voltage generating circuit, applied to said external output pin, and a reference level terminal.

24. An integrated circuit semiconductor device comprising:

at least one internal voltage generating circuit, each one thereof being supplied with an external power source of a predetermined voltage for generating, at an output thereof, an internal power source of a voltage lower than the predetermined voltage of said external power source for operating a respective one of at least one internal circuit;

wherein the output of one of said at least one internal voltage generating circuit is coupled to an external pin of the device which is connected via a diode to a back-up power source.

25. An integrated circuit semiconductor device according to claim 24, wherein one of said at least one internal circuit, powered with said internal power source, is comprised of a memory.

26. An integrated circuit semiconductor device according to claim 24, wherein there is included a bypass capacitor which couples said external pin to a source of reference potential for eliminating high frequency noise.

27. In combination, a plurality of integrated circuit semiconductor devices each comprising an internal voltage generating circuit supplied with an external power source of a predetermined voltage for generating, at an output thereof, an internal power source, for a corresponding internal circuit, of a voltage lower than said predetermined voltage; and a timing control unit for controlling the operation of the respective internal voltage generating circuits in said plurality of integrated circuit semiconductor devices at predetermined timings, whereby the internal power source generated at the outputs of the respective internal voltage generating circuits are controlled in accordance with a predetermined sequence.

28. In combination of integrated circuit semiconductor devices, a multi-value memory comprising at least one bit line and at least one word line and a plurality of multi-value memory cells, each memory cell having a drain connected to a bit line, a gate connected to a word line, and a source connected to a capacitor for storing data;

means for sensing a potential change of a respective bit line and means for binarizing an otuput from said sensing means;

means for generating a plurality of reference voltages;

an NPN transistor having a collector connected to receive a fixed power source voltage, and an emitter connected to a respective word line; and a plurality of PMOS transistors in which the drains thereof are connected to the base of said NPN transistor, the sources thereof are connected to respective ones of said plurality of reference voltages, and the gates thereof are connected to timing signals having different phases, respectively, whereby said timing signals are applied to said gates at a predetermined sequence to thereby generate a stepwise voltage on said word line.

29. A integrated circuit semiconductor device comprising:

an internal voltage generating circuit for providing, at an output thereof, an internal power source for an internal circuit by using an external power source, a voltage provided by said internal power source being lower than a voltage corresponding to said external power source, wherein said internal voltage generating circuit comrpises first and second NPN transistors and a PMOS transistor, said first and second NPN transistors are formed in a N-type island formed within a P-type semiconductor substrate, and said PMOS transistor is formed in said N-type island, and wherein said first and second NPN transistors are Darlington connected, the collectors are used as a first external power source voltage terminal, the source of said PMOS transistor is used as a second external power source voltage terminal, the drain of said PMOS transistor is connected to the base of said second NPN transistor, the gate is used as a control signal terminal, and the emitter of said first NPN transistor is used as an internal power source outputting terminal of said device, whereby a current path from the first external power source voltage terminal to said internal power source outputting terminal is formed within said N-type island.

30. An integrated circuit semiconductor device according to claim 29, wherein a voltage of about 5 V is applied to said second external power source voltage terminal, and a voltage equal to or larger than the voltage applied to said second external power source voltage terminal is applied to said first external power source voltage terminal, to thereby set the output from said internal voltage generating means approximately at 3.3 V.

31. An integrated circuit semiconductor device, comprising:

an internal circuit including at least a MOS transistor;

internal voltage generating means for providing an internal power source for said internal circuit by using an external power source, a voltage provided by said internal powr source being lower than a voltage corresponding to said external power source, said internal voltage generating means comprising an NPN transistor and a PMOS transistor each formed in a respective one of at least one N-type region disposed on a P-type semiconductor substrate;

first and second external power source terminals isolated from said substrate, said first and second external power source terminals being connected to the collector of said NPN transistor and the source of said pMOS transistor, respectively, and said second external power source terminal being supplied with a voltage which controls the conductivity of said NPN transistor;

means, isolated from said substrate, for connecting the drain of said PMOS transistor to the base of said NPN transistor;

a control signal terminal for supplying a control signal to the gate of said PMOS transistor; and an internal power source output node, isolated from said substrate, for providing the output of said internal voltage generating means from the emitter of said NPN transistor, whereby a current path from said first external power source terminal to said internal power source output node is formed only within said at least one N-type region.

32. An integrated circuit semiconductor device according to claim 31, further comprising an internal power source output terminal mounted outside of said substrate and connected to said internal power source output node.

33. An integrated circuit semiconductor device according to claim 31, wherein said at least one N-type region is an N-type well and is connected to a high potential terminal of said external power source, and said substrate is connected to a low potential terminal of said external power source.

34. An integrated circuit semiconductor device comprising:

a first external supply terminal adapted to be coupled to a main power supply;

a logic circuit portion;

a memory portion; and a second external supply terminal adapted to be coupled to a battery power supply, wherein said logic circuit portion and said memory portion are coupled to be supplied with a power voltage from said main power supply through said first external supply terminal, and wherein said memory portion is coupled to be supplied selectively with a battery voltage from said battery power supply through said second external supply terminal.

35. A large-scale integration (LSI) device comprising:

a circuit portion including a memory;

a logic portion, separate from said circuit portion;

a first external terminal for coupling to a main power source used for powering said device; and a separate second external terminal for coupling to a battery source, wherein said second external terminal is connected to a high potential terminal of said battery through a diode, a low potential terminal of said battery being at reference ground.

36. A large-scale integration device comprising:

a circuit portion including a memory;

a logic portion, separate from said circuit portion;

a first external terminal for coupling to a main power source used for powering said device; and a separate second external terminal for coupling to a battery source, at least one internal voltage generating circuit supplied by the main power source via said first external terminal for generating at an output tehreof an internal power source for operating said circuit portion and said logic portion, said internal power source being of a voltage lower than that provided by said main power source, wherein the output of said internal power source is coupled for external accessing.

37. A large-scale integration (LSI) device accordingt to claim 36, wherein the output of said internal power source is coupled to said second external terminal, said second terminal being controllably held at a predetermined potential.

38. A large-scale integration (LSI) device according to claim 37, wherein said second external terminal is connected to a high potential terminal of said battery through a diode, a low potential terminal of said battery being at reference ground.

39. A large-scale integration (LSI) device according to claim 38, further including a bypass capacitor coupled on one terminal thereof to said second external terminal and on another terminal thereof to reference ground so as to eliminate high frequency noise.

* * * * *